United States Patent [19]
Chuang

[11] Patent Number: 6,159,808
[45] Date of Patent: Dec. 12, 2000

[54] METHOD OF FORMING SELF-ALIGNED DRAM CELL

[75] Inventor: Shu-Ya Chuang, Hsinchu Hsien, Taiwan

[73] Assignees: United Semiconductor Corp.; United Microelectronics Corp., both of Hsinchu, Taiwan

[21] Appl. No.: 09/437,952

[22] Filed: Nov. 12, 1999

[51] Int. Cl.[7] ...................... H01L 21/336; H01L 21/8242
[52] U.S. Cl. .......................... 438/291; 438/250; 438/251; 438/252; 438/253; 438/393; 438/394; 438/396
[58] Field of Search .................................. 438/291, 250, 438/251, 252, 253, 393, 394, 395, 396

[56] References Cited

U.S. PATENT DOCUMENTS

| | | |
|---|---|---|
| 4,378,627 | 4/1983 | Jambotkar ................................ 438/291 |
| 5,219,777 | 6/1993 | Kang ....................................... 438/291 |
| 5,296,400 | 3/1994 | Park et al. ................................ 438/396 |
| 5,472,897 | 12/1995 | Hsu et al. ................................ 438/291 |
| 5,545,579 | 8/1996 | Liang et al. .............................. 438/291 |
| 5,956,594 | 9/1999 | Yang et al. ............................... 438/396 |
| 6,037,216 | 3/2000 | Liu et al. ................................. 438/253 |

*Primary Examiner*—Jey Tsai
*Assistant Examiner*—Jennifer M. Kennedy
*Attorney, Agent, or Firm*—Charles C. H. Wu; Charles C. H. Wu & Associates, APC

[57] ABSTRACT

A method of forming a dynamic random access memory cell such that the gate conductive layer, the bit line contact, the node contact, the bit line and the node contact plug are all formed using self-aligned processes. By employing the self-aligned method of forming DRAM cell, isolation structures are no longer etched in the process of forming the node contact opening. In addition, the aspect ratio of the node contact opening is reduced and processing window is thereby widened.

12 Claims, 5 Drawing Sheets

METHOD OF FORMING SELF-ALIGNED DRAM CELL

BACKGROUND OF THE INVENTION

1. Field of Invention

The present invention relates to a method of forming a semiconductor device. More particularly, the present invention relates to a method of forming a self-aligned dynamic random access memory (DRAM) cell.

2. Description of Related Art

FIGS. 1A through 1E are schematic cross-sectional views showing the progression of steps for forming a conventional DRAM cell. First, as shown in FIG. 1A, shallow trench isolation (STI) structures 102 are formed in a silicon substrate 100. The STI structures dissect the substrate into separate cell regions. Transistors 104 and 106 are formed above the substrate 100. Since conventional methods are used to form the transistors 104 and 106, detailed descriptions are omitted here. The transistors 104 and 106 consist of a gate conductive layer 108, a gate oxide layer 110, source/drain regions 112, a cap layer 114 and silicon nitride spacers 116.

As shown in FIG. 1B, a dielectric layer 118 is formed over the substrate 100 covering the transistors 104, 106 (FIG. 1) and the isolating structures 102. Photolithographic and etching techniques are used to pattern the dielectric layer 118 to form a bit line contact opening 120 that exposes the source/drain region 112. Polysilicon is then deposited into the opening 120 and over the dielectric layer 118 to form a polysilicon layer 122.

As shown in FIG. 1C, photolithographic and etching techniques are again used to pattern the polysilicon layer 122 to form a bit line 124 in the contact opening 120. Another dielectric layer 126 is formed over the dielectric layer 118. Using photolithographic and etching techniques, the dielectric layers 126 and 120 are patterned to form a node contact opening 128, as shown in FIG. 1D.

As shown in FIG. 1E, a contact plug 130 is formed inside the node contact opening 128. A bottom electrode 134 is next formed over the contact plug 130.

As the level of integration of devices on a chip continues to increase, the contact opening 120 in the first layer and the node contact opening 128 are formed increasingly closer to each other. In addition, the aspect ratio of the node contact opening 128 is relatively large. Consequently, particles produced during an etching operation may accumulate near the bottom of the opening. Since these particles are difficult to remove by ordinary cleaning processes, they will likely remain and lead to an increase in junction resistance with a subsequently formed conductive layer.

Furthermore, if the contact opening 128 is slightly misaligned, a portion of the isolating structure 102 may be etched leading to a leakage current. Moreover, silicon nitride spacers 116 often produce internal stresses. Thus, refreshing operations need to be carried out more often.

SUMMARY OF THE INVENTION

The present invention provides a method of forming a self-aligned DRAM cell such that a self-aligned bit line contact opening and a self-aligned node contact opening are formed on each side of a first polysilicon layer.

The invention provides a method of forming a self-aligned DRAM cell capable of preventing the removal of a portion of the isolating structures when the node contact opening is formed.

The invention provides a method of forming a self-aligned DRAM cell capable of reducing the aspect ratio of the node contact opening, thereby increasing the processing window.

The invention provides a method of forming a self-aligned DRAM cell without using silicon nitride spacers so that internal stress is greatly reduced.

To achieve these and other advantages and in accordance with the purpose of the invention, as embodied and broadly described herein, the invention provides a method of forming a self-aligned DRAM cell. A semiconductor substrate having isolating structures therein is provided. The isolating structures partition the substrate into active regions and non-active regions. A sacrificial layer is formed over the substrate. A polysilicon layer and a silicon nitride layer that cover the entire substrate are sequentially formed. Using photolithographic and etching processes, the silicon nitride layer and the polysilicon layer are patterned to form a gate opening in the active region. The bottom of the gate opening exposes a portion of the sacrificial layer whereas sidewalls of the gate opening expose a portion of the polysilicon layer. Using the silicon nitride as a mask layer, a first ion implantation is carried out, implanting ions to form an anti-punchthrough region and a channel in the substrate. The sacrificial layer is removed to expose a portion of the substrate. A gate oxide layer is formed on the exposed substrate at the bottom of the gate opening. A gate conductive layer that partially fills the gate opening is formed. The silicon nitride layer and the polysilicon layer in the non-active regions are removed retaining only a portion of the layers inside the active regions. An oxide layer covering the active regions and the non-active regions is formed over the substrate. A portion of the oxide layer is then removed in a planarization operation to expose a top surface of the silicon nitride layer. After planarization, the oxide layer and the silicon nitride layer are at identical height. At this stage, the gate conductive layer is still covered by the oxide layer. The silicon nitride layer and the polysilicon layer are removed to form a first contact opening on one side of the gate conductive layer and a second contact opening on the other side of the gate conductive layer. Using the oxide layer as a mask, a second ion implantation is carried out, implanting ions through the first and the second contact opening to form lightly doped regions in the substrate. Oxide spacers are formed on the sidewalls of the first contact opening and the second contact opening. Using the oxide layer and the oxide spacers as a mask, a third ion implantation is carried out, implanting ions into the substrate to form source/drain regions. Conductive material is deposited into the first and the second contact opening and over the oxide layer to form a first contact inside the first contact opening, a second contact inside the second contact opening and a conductive layer. Using photolithographic and etching processes, a node contact pad is formed over the first contact and a bit line is formed over the second contact. The bit line is electrically connected to the source/drain region via the second contact. A dielectric layer is formed over the oxide layer. The dielectric layer covers both the bit line and the node contact pad. Using photolithographic and etching processes, a third contact opening that exposes a portion of the node contact pad is formed in the dielectric layer. A node contact plug is formed inside the third contact opening. Finally, a bottom electrode is formed over the node contact plug.

According to one preferred embodiment of this invention, the gate oxide layer is formed by thermal oxidation. Hence, a portion of the polysilicon exposed by the gate opening will be oxidized to form an oxide spacer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
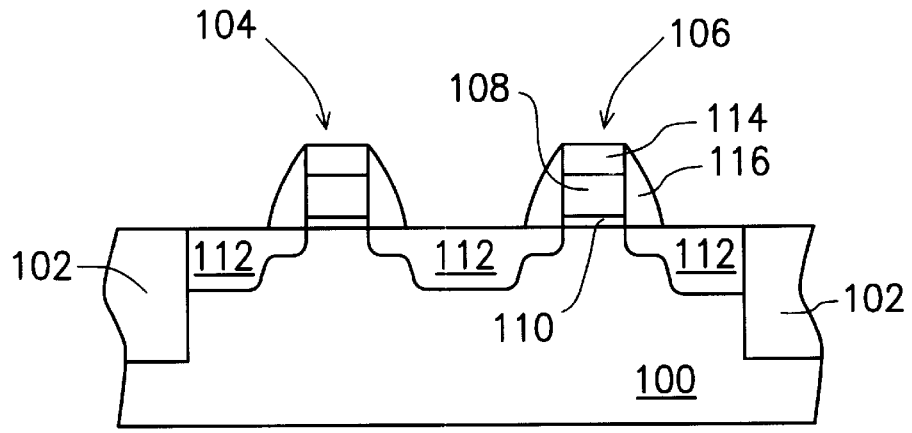
FIGS. 1A through 1E are schematic cross-sectional views showing the progression of steps for forming a conventional DRAM cell.
Figure 1B:
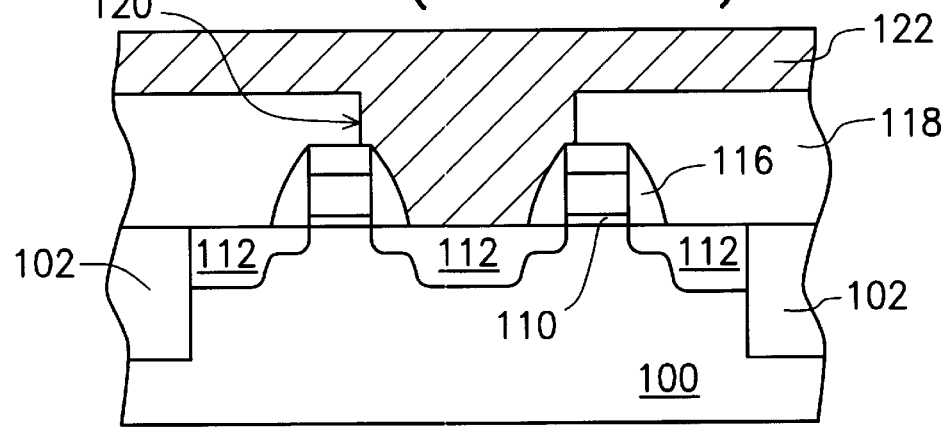
Figure 1C:
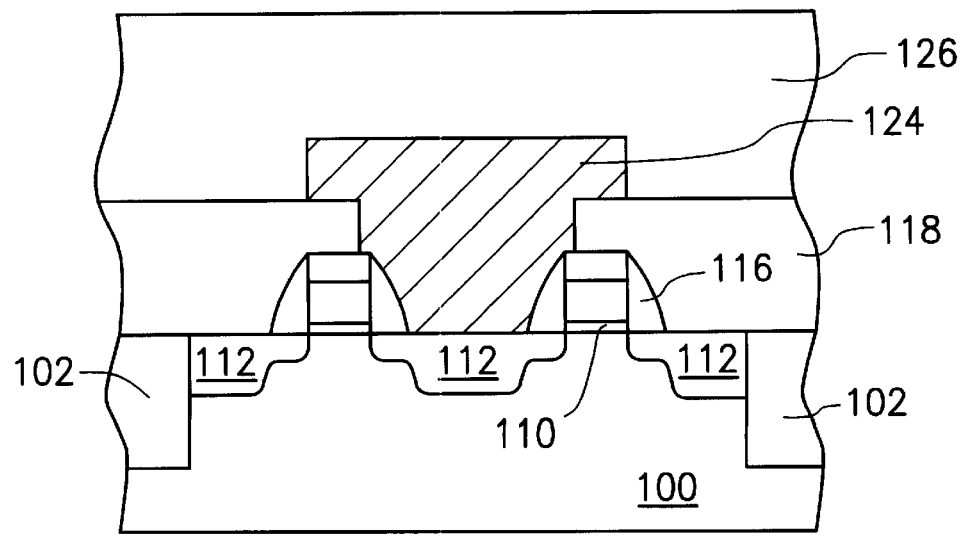
Figure 1D:
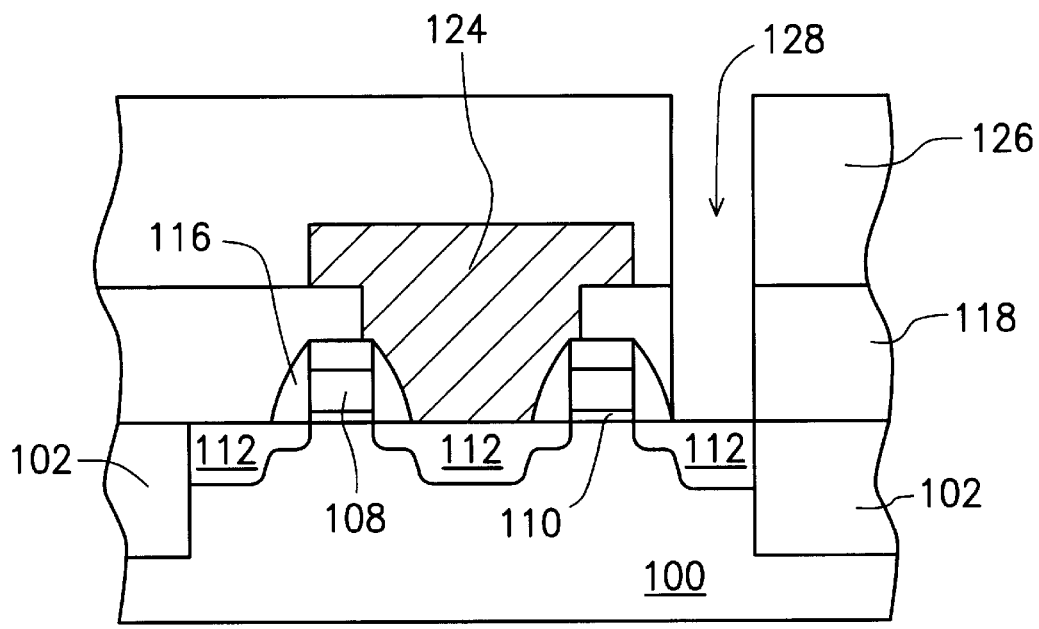
Figure 1E:
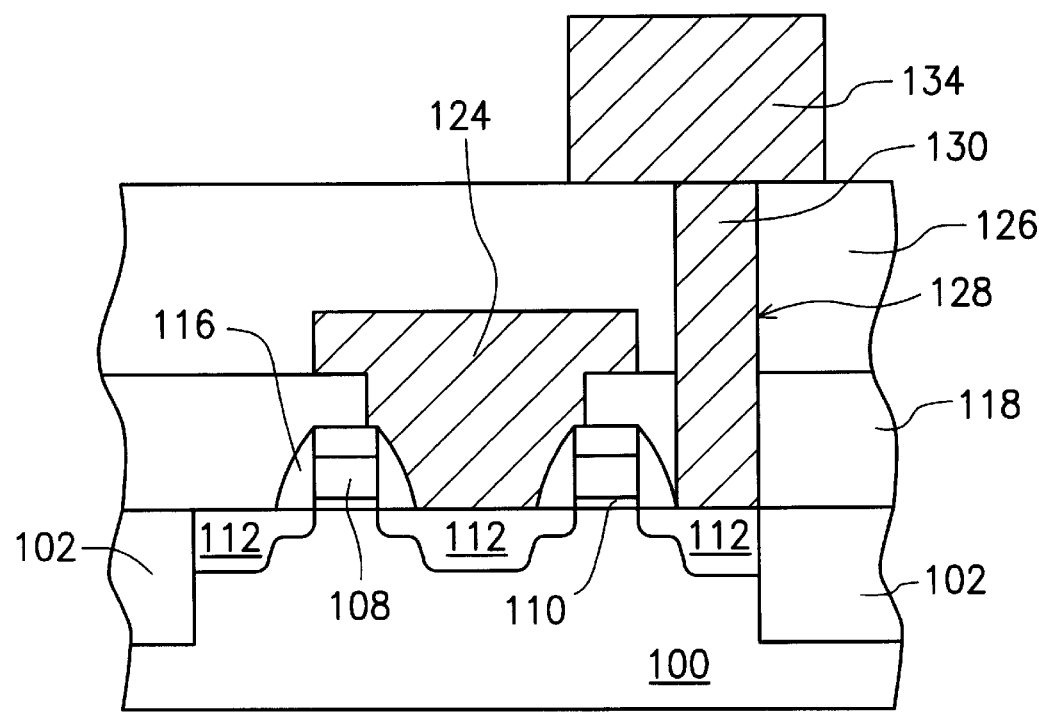

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic cross-sectional views showing the progression of manufacturing steps for producing a DRAM cell according to one preferred embodiment of this invention.

Figure 2A:
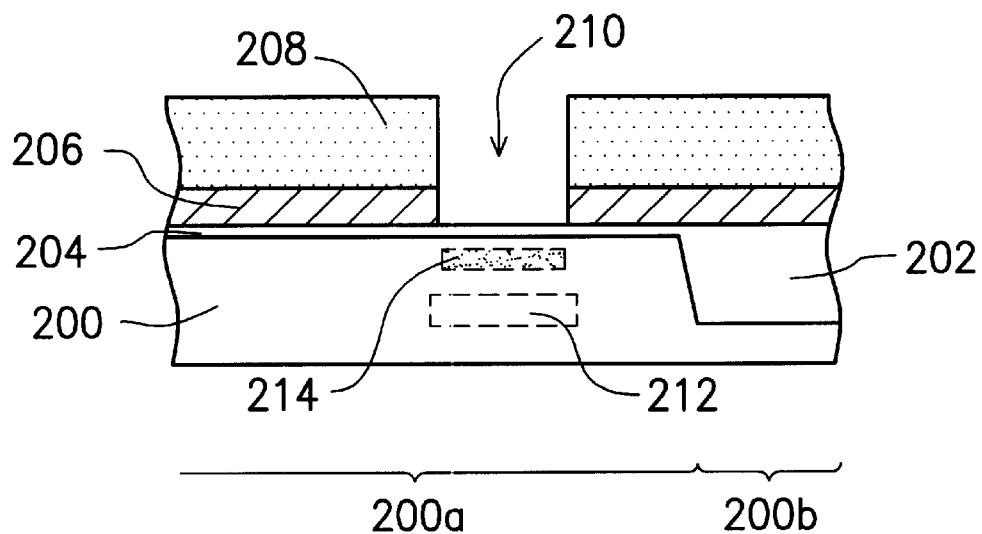
FIGS. 2A through 2F are schematic cross-sectional views showing the progression of manufacturing steps for producing a DRAM cell according to one preferred embodiment of this invention.

As shown in FIG. 2A, a substrate 200 having isolating structures 202 (such as STI) therein and a sacrificial layer 204 thereon is provided. The isolating structures 202 partition the substrate 200 into an active region 200a and a non-active region 200b. A polysilicon layer 206 and a silicon nitride layer 208 are sequentially formed over the substrate 200. The polysilicon layer 206 having a thickness of about 1000 Å and the silicon nitride layer 208 having a thickness of between 3000 Å to 4000 Å can be formed by, for example, chemical vapor deposition. Other types of material can be used instead of silicon nitride to form the layer 208 as long as the material has a high etching selectivity with respect to silicon oxide and polysilicon. Using photolithographic and etching techniques, the silicon nitride layer 208 and the polysilicon layer 206 are patterned to form a gate opening 210 that exposes a portion of the sacrificial layer 204. An ion implantation is carried out, implanting ions to form an anti-punchthrough region 212 and a channel region 214 in the substrate 200 using the silicon nitride layer 208 as a mask.

Figure 2B:
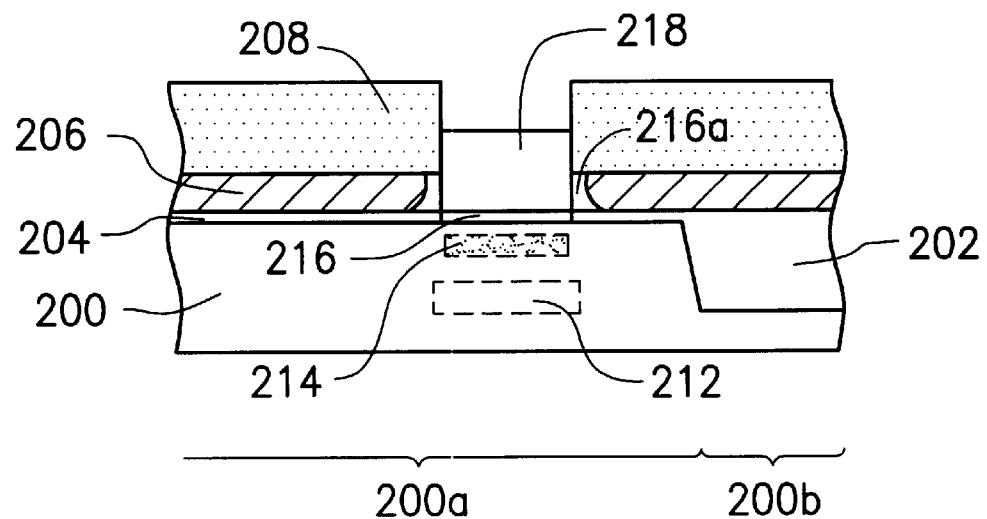

As shown in FIG. 2B, the sacrificial layer 204 at the bottom of the gate opening 210 is removed to expose a portion of the substrate 200. A gate oxide layer 216 is formed inside the gate opening 210 above the substrate 200. The gate oxide layer 216 can be formed by, for example, thermal oxidation. At the same time, a portion of the polysilicon in the sidewalls of the gate opening 210 is also oxidized, thereby forming oxide spacers 216a.

Conductive material is next deposited, partially filling the gate opening 210 to form a gate conductive layer 218. The gate conductive layer 218 can be formed by, for example, forming a conductive layer (not shown in the figure) in a chemical vapor deposition process or a physical vapor deposition process, and then etching the conducting layer.

Material for forming the gate conductive layer 218 includes tungsten or polysilicon. Note also that the top surface of the gate conductive layer 218 should be lower than the top surface of the silicon nitride layer 208 after the etching step.

Figure 2C:
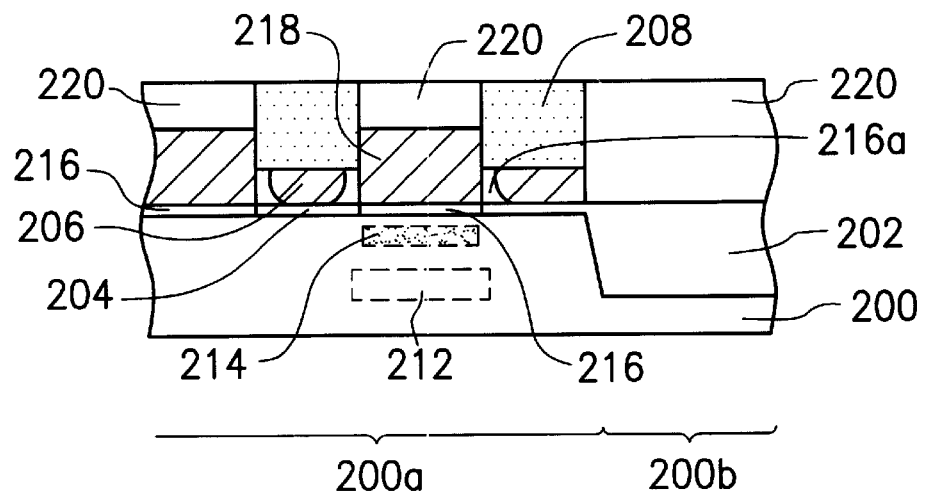

As shown in FIG. 2C, the silicon nitride layer 208 and the polysilicon layer 206 are patterned using another patterned photomask on the active regions. An anisotropic etching operation is next carried out to remove the silicon nitride layer 208 and the polysilicon layer 206 in the non-active regions 200b. Only the silicon nitride layer 208 and the polysilicon layer 206 inside the active regions 200a is retained. An oxide layer 220 is formed over the entire substrate 200 using, for example, chemical vapor deposition. The oxide layer 220 is planarized to expose the silicon nitride layer 208 by, for example, chemical-mechanical polishing. At this stage, the gate conductive layer 218 is still covered by the oxide layer 220.

Figure 2D:
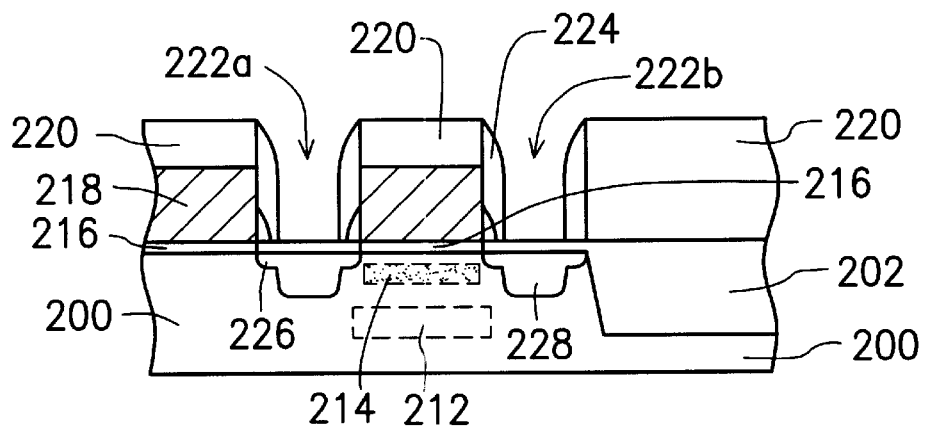

As shown in FIG. 2D, the silicon nitride layer 208 and the polysilicon layer 206 are removed to form a bit line contact opening 222a and a node contact opening 222b. The silicon nitride layer 208 and the polysilicon layer 206 can be removed by, for example, wet etching or dry etching. A second ion implantation is carried out, implanting ions through the bit line contact opening 222a and the node contact opening 222b to lightly doped regions 226 in the substrate 200. Oxide spacers 224 are formed on the sidewalls of the bit line contact opening 222a and the node contact opening 222b. A third ion implantation is carried out, implanting ions into the substrate 200 to form source/drain regions 228. Alternatively, the source/drain regions 228 can be formed somewhat later through the diffusion of dopants from the doped polysilicon inside the contact openings 222a and 222b due to a heating operation.

Figure 2E:
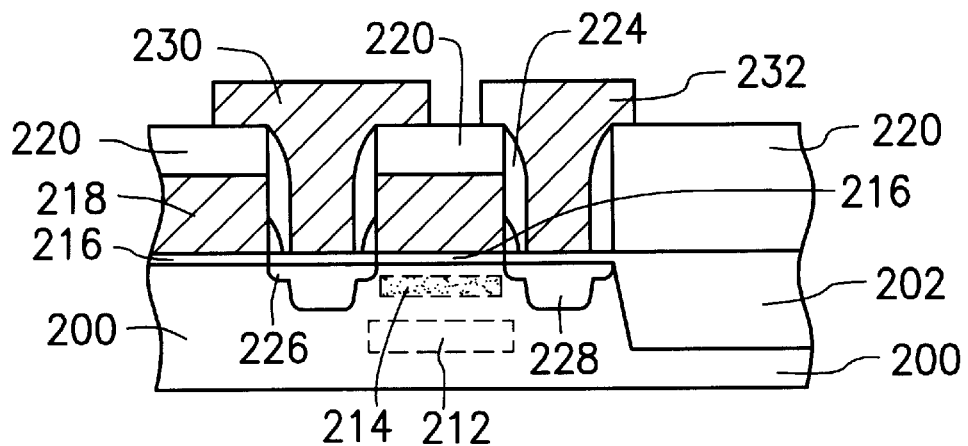

As shown in FIG. 2E, a bit line 230 that fills the bit line opening 222a and a contact pad 232 that fills the node contact opening 222b are formed. The bit line 230 and the contact pad 232 are formed by, for example, forming a conductive layer (not shown in the figure) in a chemical vapor deposition. The conductive layer fills the bit line contact opening 222a and the node contact opening 222b and covers the oxide layer 220. Material for forming the conductive layer includes polysilicon and tungsten. In the subsequent step, photolithographic and etching techniques are used to pattern the conductive layer.

Figure 2F:
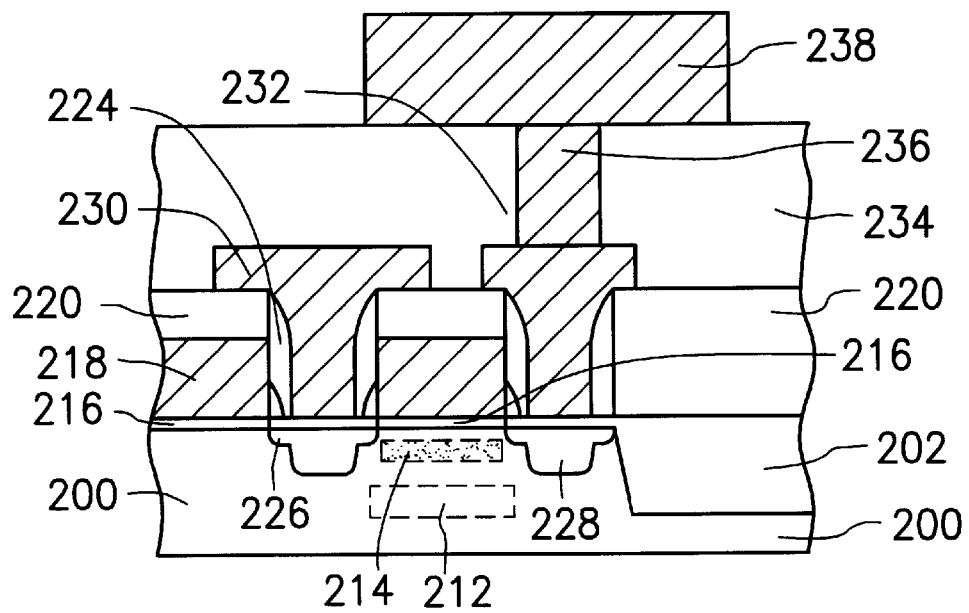

As shown in FIG. 2F, an inter-layer dielectric layer 234 is formed over the bit line 230 and the contact pad 232 by a conventional method. A contact plug 236 is formed in the dielectric layer 234. Finally, a bottom electrode 238 is formed over the contact plug 236, wherein the bottom electrode 238 is electrically connected to the contact pad 232 via the contact plug 236.

In summary, characteristics of this invention includes:

1. Since the gate conductive layer, the bit line contact opening and the node contact opening are formed through a self-aligned process, errors due to alignment can be avoided and the processing window is increased.

2. The ions needed to form the anti-punchthrough region, the channel region and the source/drain region are channeled into the substrate. Hence, the process is self-aligned.

3. The process of forming the bit line and the contact pad is also self-aligned.

4. By forming a contact pad, the aspect ratio of the node contact opening is reduced. Hence, fewer residual particles accumulate at the bottom of a contact opening after a cleaning operation. In addition, the removal of a portion of the isolating structure due to the misalignment of contact opening can also be avoided.

5. Since silicon nitride spacers are not used, stress accumulation problem can be avoided.

6. Every step of the invention results in a relatively smooth surface. Hence, the resolution of photolithographic processes will improve overall.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a self-aligned dynamic random access memory cell, comprising:

providing a semiconductor substrate having isolation structures including active regions and non-active regions;

forming a sacrificial layer over the substrate;

forming a polysilicon layer over the sacrificial layer;

forming a silicon nitride layer over the polysilicon layer;

patterning the silicon nitride layer and the polysilicon layer using photolithographic and etching processes to form a gate opening in the active region that exposes a portion of the sacrificial layer, wherein a sidewall of the gate opening exposes a portion of the polysilicon layer;

implanting ions into the substrate using the silicon nitride layer as a mask so that an anti-punchthrough region and a channel region are formed;

removing the sacrificial layer to expose a portion of the substrate;

forming a gate oxide layer at the bottom of the gate opening;

forming a gate conductive layer inside the gate opening, wherein the gate conductive layer only partially fills the gate opening;

removing the silicon nitride layer and the polysilicon layer in the non-active regions;

forming an oxide layer over the active regions and the non-active region;

planarizing the oxide layer by removing a portion of the oxide layer so that the top surface of the silicon nitride layer is exposed and the oxide layer and the silicon nitride layer are at a same height, but the gate conductive layer is still covered by the oxide layer;

removing the silicon nitride layer and the polysilicon layer so that a first contact opening is formed on one side of the gate conductive layer while a second contact opening is formed on another side of the gate conductive layer;

implanting ions into the substrate through the first contact opening and the second contact opening using the oxide layer as a mask to form a lightly doped region;

forming oxide spacers on sidewalls of the first and the second contact opening;

implanting ions into the substrate using the oxide layer and the oxide spacers as a mask to form a source/drain region;

forming a conductive layer that fills the first and the second contact opening and covers the oxide layer;

patterning the conductive layer by performing photolithographic and etching processes to form a node contact pad above the first contact and to form a bit line above the second contact, wherein the bit line is electrically connected to the source/drain region via the second contact;

forming a dielectric layer over the oxide layer, the bit line and the node contact pad;

patterning the dielectric layer using photolithographic and etching processes to form a third contact opening that exposes the node contact pad;

forming a node contact plug inside the third contact opening; and forming a bottom electrode above the node contact plug.

2. The method of claim 1, wherein the step of forming the gate oxide layer includes thermal oxidation.

3. The method of claim 2, wherein the step of forming a gate oxide layer at the bottom of the gate opening, further includes oxidizing a portion of the polysilicon on the sidewalls of the gate opening to form oxide spacers.

4. The method of claim 1, wherein the step of filling the gate opening with conductive material to form the gate conductive layer includes the substeps of:

forming a gate conductive layer over the silicon nitride layer and filling the gate opening; and etching the gate conductive layer to retain only a portion of the gate conductive layer inside the gate opening.

5. The method of claim 1, wherein material for forming the gate conductive layer includes polysilicon.

6. The method of claim 1, wherein material for forming the gate conductive layer includes tungsten.

7. The method of claim 1, wherein material for forming the conductive layer includes polysilicon.

8. The method of claim 1, wherein material for forming the conductive layer includes tungsten.

9. The method of claim 1, wherein the step of planarizing the oxide layer includes chemical-mechanical polishing.

10. The method of claim 1, wherein the isolation structures includes shallow trench isolation.

11. The method of claim 1, wherein the first contact includes a bit line contact.

12. The method of claim 1, wherein the second contact includes a node contact.

* * * * *